(12) United States Patent
Hantschel et al.

(10) Patent No.: US 6,788,086 B2
(45) Date of Patent: Sep. 7, 2004

(54) SCANNING PROBE SYSTEM WITH SPRING PROBE

(75) Inventors: Thomas Hantschel, Menlo Park, CA (US); Eugene M. Chow, Stanford, CA (US); David K. Fork, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/717,803

(22) Filed: Nov. 19, 2003

(65) Prior Publication Data

US 2004/0123651 A1 Jul. 1, 2004

Related U.S. Application Data

(62) Division of application No. 10/112,215, filed on Mar. 29, 2002, now Pat. No. 6,668,628.

(51) Int. Cl.[7] ............................................... G01R 31/02
(52) U.S. Cl. ..................................................... 324/762
(58) Field of Search ........................... 73/105; 250/306, 250/307; 324/754, 756, 758, 759, 761, 762, 724

(56) References Cited

U.S. PATENT DOCUMENTS

| | | | |
|---|---|---|---|
| 3,842,189 A | 10/1974 | Southgate | |
| 5,399,232 A | 3/1995 | Albrecht et al. | |
| 5,613,861 A | 3/1997 | Smith et al. | |
| 6,130,464 A | * 10/2000 | Carr | ............................ 257/417 |
| 2002/0040884 A1 | 4/2002 | Hantschel et al. | |
| 2002/0047091 A1 | 4/2002 | Hantschel et al. | |
| 2002/0079445 A1 | 6/2002 | Hantschel et al. | |

* cited by examiner

Primary Examiner—Robert Raevis
(74) Attorney, Agent, or Firm—Bever, Hoffman & Harms, LLP; Patrick T. Bever

(57) ABSTRACT

Scanning probe systems, which include scanning probe microscopes (SPMs), atomic force microscope (AFMs), or profilometers, are disclosed that use cantilevered spring (e.g., stressy metal) probes formed on transparent substrates. When released, a free end bends away from the substrate to form the cantilevered spring probe, which has an in-plane or out-of-plane tip at its free end. The spring probe is mounted in a scanning probe system and is used to scan or otherwise probe a substrate surface. The probes are used for topography, electrical, optical and thermal measurements.

24 Claims, 9 Drawing Sheets

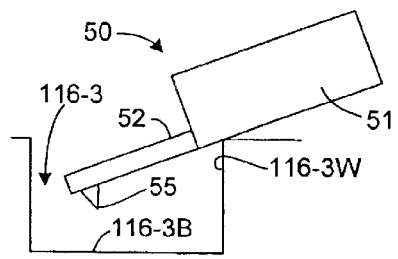
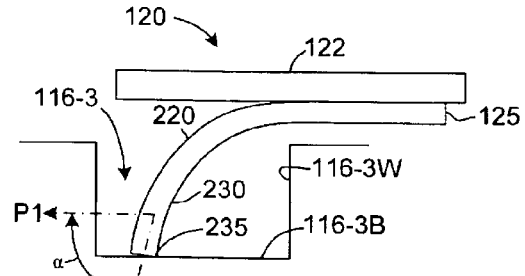
FIG. 3(A) (PRIOR ART)
FIG. 4(A)
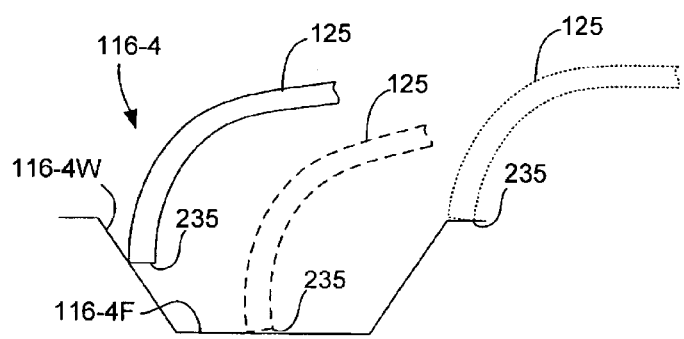
FIG. 4(B)
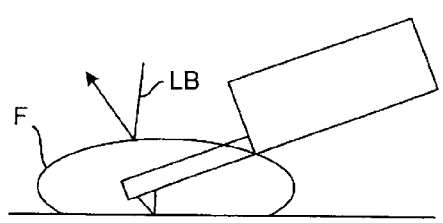
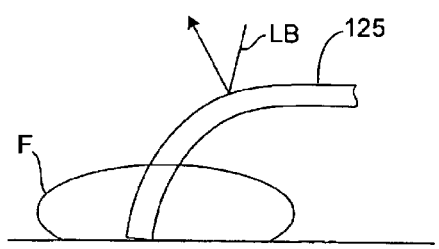
FIG. 3(B) (PRIOR ART)
FIG. 4(C)

SCANNING PROBE SYSTEM WITH SPRING PROBE

RELATED APPLICATION

The present application is a divisional of U.S. patent application Ser. No. 10/112,215 filed by Thomas Hantschel, Eugene M. Chow and David K. Fork on Mar. 29, 2002, now U.S. Pat. No. 6,668,628.

FIELD OF THE INVENTION

This invention relates generally to scanning probe systems, such as scanning probe microscopes and profilometers, and more particularly to the probe assemblies used in these scanning probe systems.

BACKGROUND OF THE INVENTION

Scanning probe microscopy (SPM; also known as atomic force microscopy (AFM)) is considered a spin-off of scanning tunneling microscopy (STM). An SPM system measures the topography of a sample by scanning (sliding) a probe having a small tip over the sample's surface and monitoring the tip position in the z-direction at each point along the scan path. Alternatively the SPM probe can be used as a nano-Spreading Resistance Probe (nano-SRP), used for the determination of the resistance and carrier profile of a semiconductor element, or for nano-potentiometry measurements of the electrical potential distribution on a semiconductor element.

FIG. 24 is a perspective view showing a conventional SPM system 40. SPM system 40 includes a movable XY stage 42 for supporting a sample 45, a probe 50 mounted to a suitable structure (holder plate) 60, a probe measurement device 70, and a computer/workstation 80 that serves as both a system controller and a measurement data processor. Holder plate 60 is movable in the z-axis direction by a suitable motor (e.g., a piezoelectric device) to selectively position probe 50 relative to sample 45. Similar motors (not shown) drive XY stage 42 in the xy-plane, thereby causing probe 50 to scan along the upper surface of sample 45, when the probe is in the lowered position. Computer 80 generates control signals that are utilized to control the movements of holder plate 60 and XY stage 42. In most conventional SPM systems, the up-and-down motion of probe 50 is detected by measurement device 70 using the so-called "optical lever" method, wherein a laser beam LB generated by a laser 72 shines onto a cantilever surface of probe 50, and the reflected beam hits a two- or four-segment photodiode 75. Measurement data generated by photodiode 75 is passed to computer 80, which processes the measurement data, and typically generates a magnified view of the scanned sample.

FIG. 25 shows probe 50 in additional detail. Probe 50 includes a holder chip (mounting block) 51, a straight cantilever section (stylus) 52 extending from holder chip 51, and an "out-of-plane" tip 55 that extends perpendicular to cantilever section 52. Probe 50 is supported by holder block 60 at an angle to facilitate contact between tip 55 and an upper surface of sample 45. The choice of the materials from which holder chip 51, cantilever section 52, and tip 55 are composed depends on the type of measurement the probe is intended for. For topography measurement, a dielectric or a semi-conductive tip can be used, whereas for resistance determination and nano-potentiometry require a highly conductive tip, preferably with high hardness and low wear.

One problem associated with conventional probes is that they are expensive and difficult to produce. Conventional probes are typically formed by bulk micromachining high quality, and therefore expensive, monocrystalline silicon (Si) wafers. As indicated in FIG. 25, the relatively large size of each probe 50 is due to the integrated holder chip 51, which is mounted to holder plate 60, and cantilever 52, which must extend from under holder plate 60 to facilitate the "optical lever" measurement method. Further, the probes are separated from the Si substrates by etching away the wafer material beneath the probe, which is a time-consuming and costly process. Because of their relatively large size, and because much of the Si substrate is etched or otherwise destroyed during the production process, relatively few probes 50 are formed from each expensive Si wafer, thereby making the cost of each conventional probe 50 relatively high.

Another problem associated with conventional probes is that out-of-plane tips 55 must be fabricated during a separate process from that used to form holder chip 51 and cantilever section 52, and probe 50 must be mounted onto holder plate 60 at an angle relative to an underlying sample 45. Conventional methods needed to form out-of-plane tips, such as tip 55 shown in FIG. 25, add time and expense to the probe manufacturing process. Most conventional out-of-plane probe tips are either etched out of a material (e.g. Si) or they are molded (a pyramidal mold is formed by anisotropic Si etching, the mold is filled up with a material such as a metal or diamond, the mold material is removed). Further, the tip height is limited to only about 15 $\mu$m, so probe 50 must be mounted onto holder plate 60 at an angle relative to an underlying sample 45 to facilitate contact between tip 55 and sample 45. To facilitate this angled probe orientation, conventional holder plate 60 is provided with an angled portion 65 to which holder chip 51 is mounted. This mounting process also takes time, and is required for each probe mounted in an SPM system.

At this moment, there is no other SPM technology available which allows the manufacture of scanning probes on wafer scale that can be used to measure structures with high and super-high topography. An important issue in such processing is often to measure the roughness on the bottom of deep structures, and also the top-bottom step height of the structures. Conventional probe 50 cannot do such measurements for two reasons. First, tip 55 is only 5–15 $\mu$m high, which determines the deepest structure that can be measured. Second, cantilever 51 is perfectly straight and in-plane with holder chip 52, which means that the probe would bump against the substrate surface if tip 55 enters a structure deeper than the height of tip 55. Step height measurements are commonly done by profilometers that use special probes (i.e., sharpness as small as 10 nm) that can measure large step heights (e.g., 30 to 50 $\mu$m). However, these profilometer probes cost up to ten times as much as SPM probes.

What is needed is a probe structure for scanning probe systems that avoids the problems associated with conventional probes that are described above.

SUMMARY OF THE INVENTION

The present invention directed to spring probe assemblies for scanning probe systems (e.g., scanning probe microscopes (SPM) and profilometer systems) that are formed using stress-engineered spring material films. Each spring probe includes a fixed end (anchor portion) attached to a transparent (e.g., glass or quartz) substrate, and a cantilever (central) section bending away from the substrate. Curvature of the cantilever section is selectively controlled to form a long free end terminating in a tip that is located in the range of 15 to 500 μm from the substrate. The probe assembly, which includes the substrate and the spring probe, is then mounted in scanning probe system such that the probe tip is scanned over the surface of a sample. A conventional measurement device (e.g., a laser beam and photosensor array) is utilized to detect tip movement while scanning.

Spring probes of the present invention are formed by forming (e.g., sputtering, chemical vapor deposition, or electroplating) a spring material (e.g., metal, silicon, nitride, or oxide) onto a substrate while varying the process parameters (e.g., pressure, temperature, and applied bias) such that a stress-engineered spring material film is formed with an internal stress gradient in the growth direction (i.e., normal to the substrate). The spring material film is then etched to form an elongated island of spring material, and an anchor portion (fixed end) of the spring material island is then masked. The unmasked portion of the spring material island is then "released" by removing (etching) a sacrificial material located under the unmasked portion. In one embodiment, the sacrificial material removed during the release process is a separate "release" material layer (e.g., Si, SiNx, SiOx, or Ti) that is formed between the substrate surface and the spring material film. In another embodiment, the spring material film is formed directly on the substrate (e.g., glass), and the substrate itself is etched during the release process. The cantilever portion of the released spring probe bends away from the substrate due to the internal stress gradient of the spring material film, while the anchor portion remains secured to the substrate. Controlling, for example, the thickness of the spring material film produces a selected curvature of the cantilever section. To produce curvature variances and straight sections in the cantilever section, stress-reducing layers are deposited on selected sections of the spring material island prior to release. In yet another embodiment, a substrate is coated with resist and patterned to define the probe area. A material stack (including release layer and spring material film) is then deposited over the entire substrate. A lift-off step (e.g., submersion in acetone and applied ultrasonic agitation) is then used to remove the material outside the probe area. The advantage of the lift-off process is that it works with nearly any metal, whereas the etching process allows only for metals that etch well.

The spring probes of the present invention provide several advantages over conventional probes.

First, the spring probes of the present invention facilitate topography measurements that are not possible using conventional probes. In particular, the long, relatively vertical free end of the cantilever section is able to access and measure structures that are deeper and narrower than those measurable by conventional probes, and can scan very close to structures at edges and even on the sidewalls of deep structures. For example, the spring probes are able to measure deep and/or high-aspect-ratio Micro Electrical Mechanical System (MEMS) devices, and perform non-destructive depth profiling of wafers structured by deep reactive ion etching (DRIE), which are not possible using conventional probes. The long, relatively vertical free end the cantilever section also facilitates measurements in liquids and on biological samples, which are also not typically possible using conventional probes.

Another advantage provided by the spring probes of the present invention arises when the spring probes are formed on transparent (e.g., glass) substrates. As mentioned above, conventional probes are bulk micromachined (i.e., separated from an Si substrate), and therefore require a relatively large base portion that is attached to a holder chip in an SPM system. In contrast, because the substrate of each probe assembly is secured to a holder chip, and because the spring probe is fabricated directly on and released from the substrate, the base portion required in conventional probes is not required, thereby allowing the probe assembly of the present invention to be smaller in geometry than conventional probes. Further, because the substrate extends the entire length of the released spring probe, the substrate serves to protect the probe tip during transportation and mounting on holder chip. In contrast, the tips of conventional probes are exposed and often broken during transportation and mounting.

Further, the spring probes of the present invention are significantly less expensive to produce than conventional probes. The spring probes of the present invention can be fabricated using standard lithographic processes on inexpensive glass substrates, as compared to conventional probes that are typically bulk micromachined from high-quality, and therefore expensive, Si substrates. Conventional probes require etching away the entire substrate beneath each probe, which is a time-consuming and costly process, and yields a relatively small number of probes per wafer. In comparison, the spring probes of the present invention are formed using a relatively inexpensive and space efficient lithographic process that yields a significantly larger number of spring probes per wafer. Another advantage is that spring probe fabrication uses a mask aligner with only topside alignment capability, whereas conventional probe fabrication requires special and expensive aligners with backside alignment capability.

Yet another advantage is provided when the tip of each spring probe is formed "in-plane" (i.e., by shaping the spring material), as opposed to being formed out-of-plane using a conventional tip-forming technique. Conventional out-of-plane tip forming techniques require depositing or etching tip material (e.g., Si, diamond, or carbon-nanotube) on the spring material island after the spring material film is etched. In-plane tips minimize manufacturing costs because they are formed from spring material located at the free end of the cantilever section during the same etching step used to form the spring material island. Further, in-plane tips allow for narrower probe tips, which facilitates inspection of the probed region, in contrast to conventional probes that require wide tips in order to support out-of-plane tips. In other embodiments, a wider structure is formed at the free end of the cantilever section, and an out-of-plane tip is formed using a conventional method.

Yet other advantages are provided by probe assemblies of the present invention due to their curved or bent shape. Conventional probes are straight, and must be mounted on angled surfaces formed on holder plates to achieve the proper orientation necessary to contact a sample surface in an SPM system. In contrast, the fixed ends (anchor portion) of the curved/bent spring probes are oriented parallel to the sample surface, while the free end of the cantilever section can be aligned perpendicular to the sample surface. In addition to the advantages associated with measuring super-high-topography samples and depth gauging on micrometer scale, this parallel orientation produces unique properties and adds completely new functionality to SPM systems and profilometers. For example, the parallel orientation facilitates economically produced multi-probe arrays that include multiple spring probes, arranged both in-line and/or parallel, formed on a holder chip (substrate) using a single lithographic process. Similar multi-probe arrays using conventional probes would require the tedious and expensive process of separately mounting each conventional probe on angled surfaces of a holder plate. Multi-probe arrays formed in accordance with the present invention provide several cost saving and unique functions. For example, when the spring probes are formed using electrically conductive material (e.g., metal), two- and four-tip parallel probe arrays may be utilized to measure electrical properties on a sample surface while viewing the probed area through the transparent substrate.

BRIEF DESCRIPTION OF THE DRAWINGS

These and other features, aspects and advantages of the present invention will become better understood with regard to the following description, appended claims, and accompanying drawings, where:

FIGS. 3(A) and 3(B) are side views showing conventional probes during operation;

FIGS. 4(A), 4(B), and 4(C) are side views showing spring probes of the present invention during operation;

DETAILED DESCRIPTION OF THE DRAWINGS

The present invention is described below with reference to scanning probe systems, and in particular to scanning probe microscope (SPM) and profilometer systems. However, the present invention is not limited to these specific systems, and the term "scanning probe system" is defined herein to further include atomic force microscopy (AFM) systems, such as the Multimode- and Dimension-series AFMs produced by the Vecco Metrology Group of Digital Instruments (Santa Barbara, Calif.). The term "scanning probe system" is defined herein to further include magnetic force microscopy (MFM) systems, photonic force microscopy (PFM) systems, near field scanning optical microscopy (SNOM/NSOM) systems, scanning tunneling microscopy (STM) systems, force modulation microscopy (FFM) systems, scanning capacitance microscopy (SCM) systems, scanning spreading resistance microscopy (SSRM) systems, tunneling atomic force microscopy (TUNA) systems, scanning thermal microscopy (EFM) systems, electrostatic force microscopy systems, phase detection microscopy (PDM) systems, magnetic force microscopy (MFM) systems, lateral force microscopy (LFM) systems, scanning chemical force microscopy (SCFM) systems, scanning electrochemical microscopy (SEcM) systems, scanning Kelvin probe microscopy (SKPM) systems, scanning chemical potential microscopy (SCPM) systems, scanning ion conductance microscopy (SICM) systems, and nanopotentiometry systems. This list is not intended to be exhaustive.

Figure 1:
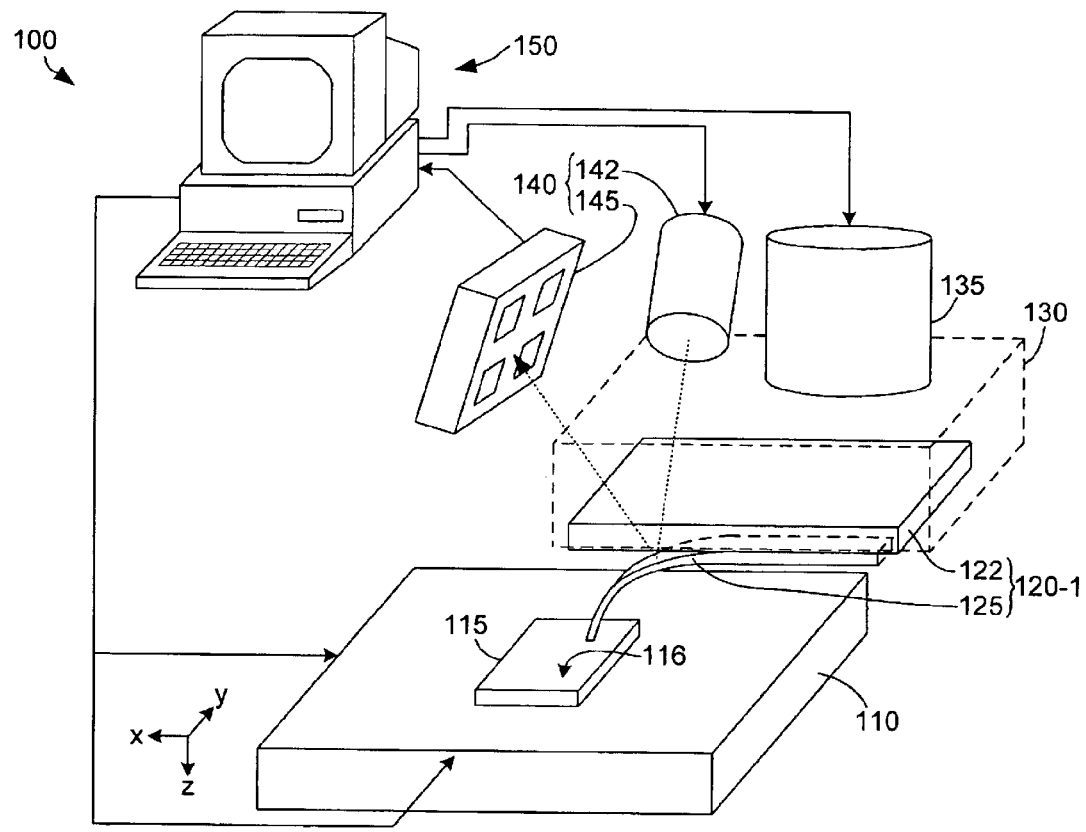
FIG. 1 is a perspective view showing a scanning probe microscope system according to an embodiment of the present invention.

FIG. 1 is a perspective view showing a scanning probe microscope (SPM) system 100 according to an embodiment of the present invention. SPM system 100 includes a movable XY stage 110 for supporting a sample 115, a probe assembly 120-1 mounted to a suitable structure (holder plate) 130, a probe measurement device 140, and a computer/workstation 150 that serves as both a system controller and a measurement data processor. Probe assembly 120-1 includes a transparent (e.g., glass, quartz, or a plastic material such as plexiglass or SU8) substrate 122 and a curved spring probe 125 (discussed in detail below) that extends downward from substrate 122 to contact a surface 116 of sample 115. Holder plate 130 is movable in the z-axis direction by a suitable motor 135 (e.g., a piezoelectric device) to selectively position probe assembly 120-1 relative to sample 115. Similar motors (not shown) drive XY stage 110 in the xy-plane, thereby causing spring probe 125 to scan along surface 116, when spring probe 125 is in the lowered position. Computer 150 generates control signals that are utilized to control the movements of holder plate 120-1 and XY stage 110. Displacement of spring probe 125 in the z-direction caused by topographic changes on surface 116 during scanning are detected by measurement device 140, which in the present embodiment includes a laser 142 and a photosensor array 145. Measurement data generated by photosensor array 145 is passed to computer 150, which processes the measurement data, and typically generates a magnified view of surface 116.

Figure 2:
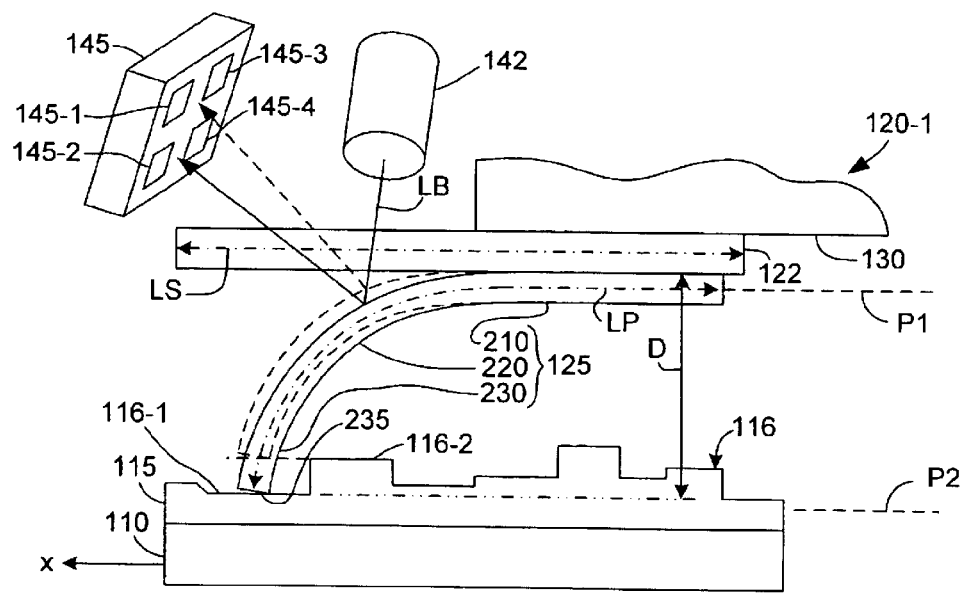
FIG. 2 is a simplified cross-sectional sectional view showing a probe array of the scanning probe microscope system in additional detail.

FIG. 2 is a simplified cross-sectional sectional view showing probe array 120-1 in additional detail. As indicated in FIG. 2, spring probe 125 includes a fixed end (anchor portion) 210 attached to substrate 122, a curved cantilever section 220 bending away from substrate 122, and a free end 230 including a tip 235 that contacts surface 116 of sample 115. Spring probe 125 has a length LP in the range of 50 microns to one millimeter, and a width (measured perpendicular to the drawing sheet) in the range of 1 to 100 microns, which dimensions being determined by the particular use and tip formation of the probe. Substrate 122 has a length LS that is equal to or greater than LP, so an end 123 of substrate 122 extends over cantilever section 220 after release. During fabrication (discussed in detail below), the curvature of cantilever section 220 is selectively controlled such that tip 235 is located a distance D that is in the range of 10 μm to 1 mm from substrate 122, again depending on the particular probe application. As tip 235 scans along surface 116 (i.e., as stage 110 is translated in the x-direction), the varying topographic features of surface 116 cause tip 235 to displace in the z-axis direction against the resilient bias of cantilever section 220. For example, when tip 235 is located over relatively low point 116-1, cantilever section 220 pushes tip 235 downward (i.e., away from substrate 122). In contrast, when stage 110 is translated in the x-direction and tip 235 is positioned over relatively high point 116-2, tip 235 is displaced upward against the resilient bias of cantilever section 220 (as indicated by dashed lines). In the present embodiment, this displacement is measured by detecting changes in the laser light received by photosensor array 145. In particular, when tip 235 abuts low point 116-1, laser beam LB is reflected from cantilever section 220 to strike a first region of photosensor array 145. When tip abuts high point 116 and is displaced upward, the angle of cantilever section 220 is altered by a corresponding amount, resulting in laser light LB striking a different region of photosensor array 145. The laser light striking the different regions of photosensor array 145 are measured and passed to computer 150 (FIG. 1) for processing to form a magnified image.

Probe assembly 120-1 differs from conventional probes in several respects, and provides several unique advantages due to the curved cantilever section 220 of spring probe 125, and to the use of transparent substrate 122.

FIGS. 3(A), 3(B) and 4(A) through 4(C) illustrate several advantages the curved cantilever shape of spring probe 125 provides over conventional probes 50. In particular, these figures illustrate that curved cantilever section 220 and downward pointing free end 230 facilitate super-high topography measurements that are not possible using conventional probes. The present inventors have already fabricated spring probes 125 with lift heights up to several hundred microns and demonstrated imaging at the base of deep trenches with these probes.

Referring to FIGS. 3(A), conventional probe 50 is limited by straight cantilever section 52 to measuring relatively shallow pits or trenches formed in a sample surface. Such deep structures are produced, for example, by deep reactive ion etching (DRIE), SU-8 processing, anisotropic etching, LIGA (German acronym for lithography, electroplating, and molding processing), and thick resist processing. Such structures can be hundreds of microns deep. An important issue in such processing is often to measure the roughness on bottom 116-3B, and the top-bottom height of side wall 116-3W. As indicated in FIG. 3(A), conventional probe 50 cannot do such measurements because of two reasons: tip 55 is only 5–15 μm high, which determines the deepest structure conventional probe 50 can measure, and cantilever second 52 is perfectly straight and in-plane with holder chip 51, causing chip 51 or cantilever 52 to bump against side wall 116-3W, thereby preventing tip 55 from contacting bottom surface 116-3B. Consequently, measurements taken from conventional probe 50 erroneously indicate a much shallower structure, and details regarding topographical features on bottom 116-3B cannot be obtained.

In contrast, as shown in FIGS. 4(A) and 4(B), by forming spring probe 125 with a steeply angled free end 230 (e.g., an angle α in the range of 10 to 90 degrees), tip 235 is able to access and measure structures that are deeper and narrower than those measurable by conventional probes, and can scan very close to structures at edges and even on the sidewalls of deep structures. That is, instead of relying on the length of conventional tip 55 (see FIG. 3(A)), which is only 5 to 10 μm long, curved cantilever section 220 is maintained away from the sample surface, and free end 230 is utilized to probe into deep and narrow opening 116-3 without abutting side wall 116-3W, thereby allowing topographic measurements of bottom 116-3B. The ability to measure deep and narrow structures facilitates measuring deep and/or high-aspect-ratio MEMS devices, and facilitates non-destructive depth profiling of wafers structured by deep reactive ion etching (DRIE), which are not possible using conventional probes. Further, as indicated in FIG. 4(B), spring probe 125 facilitates measuring sidewalls 116-4W of high topography structures 116-4, which is also not possible using conventional probes.

Spring probe 125 facilitates many additional scanning probe applications that are not possible using conventional probes. The present inventors have used spring probes 125 to perform SPM measurements on fully processed MEMS wafers with high surface structures (e.g., lifted beam and mirror arrays, high post structures). For example, the high lift height (i.e., distance D in FIG. 2) of spring probes 125 also facilitates characterizing samples in biology and material science. As indicated in FIG. 3(B), conventional probe 50 provides a relatively short cantilever section for reflecting laser beam LB when encountering a liquid droplet 410. In contrast, as shown in FIG. 4(C) spring probes 125 provide substantially longer cantilever sections 220 that remain out of liquid droplet 410 during measurement.

Referring again to FIG. 2, another unique feature associated with probe assembly 120-1 is that laser beam LB shines through substrate 122. In conventional probe assemblies, the total length of the probe includes a base portion secured to the holder chip, and a straight cantilever portion that extends from an end of the holder chip. Because substrate 122 is secured to holder chip 130, and because spring probe 125 is fabricated directly on and released from substrate 122, the base portion required in conventional probes is not required in probe assembly 120-1, thereby allowing probe assembly 120-1 to be smaller in geometry than conventional probes. Further, because substrate 122 extends over cantilever section 220, substrate 122 serves to protect tip 235 of spring probe 125 during transportation and mounting on holder chip 130. In contrast, the tips of conventional probes are exposed and often broken during transportation and mounting.

FIGS. 5(A) through 5(H) are simplified cross-sectional side views showing a general fabrication process utilized to produce a probe assembly 120-5 according to another embodiment of the present invention.

Figure 5A:
FIGS. 5(A), 5(B), 5(C), 5(D), 5(E), 5(F), 5(G), and 5(H) and are simplified cross-sectional side views showing a general fabrication process utilized to produce probe assemblies according to another embodiment of the present invention.

Referring to FIG. 5(A), the fabrication process begins by forming a release layer 510 on a wafer 501. Wafer 501 is formed from a selected substrate material (e.g., glass, quartz, silicon (Si), sapphire, aluminum oxide, or a suitable plastic). As described herein, a transparent substrate material provides additional advantages in many SPM applications. In one embodiment, release layer 510 includes one or more of Si, a silicon nitride composition (SiNx), a silicon oxide composition (SiOx), or titanium (Ti) that is deposited onto wafer 522. As described below, the release material is selected such that the spring probe remains connected via a portion of release material layer 510 to wafer/substrate 501 after release. In an alternative embodiment, a separate anchor pad is separately formed adjacent to the release material that serves to connect the spring probe to wafer/substrate 510. While such a separately formed anchor pad may increase the strength of the spring probe/substrate connection, the formation of such an anchor pad would increase the number of process steps, thereby increasing the total probe manufacturing cost. In yet another alternative embodiment, the substrate material of wafer 522, may itself be used as the release layer 510, (i.e., a separate release material deposition process is not used, and spring probe 125 is connected directly to substrate 122, as shown in FIG. 2).

Figure 5B:

Next, as shown in FIG. 5(B), a stress-engineered (spring) film 520 is formed on release layer 510 using known processing techniques such that film 520 includes internal stress variations in the growth direction. For example, in one embodiment, spring material film 520 is formed such that its lowermost portions (i.e., adjacent to release material layer 510) has a higher internal compressive stress than its upper portions, thereby forming internal stress variations that cause a bending bias away from wafer 501. Methods for generating such internal stress variations in spring material film 520 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, stress-engineered spring material film 520 includes one or more metals suitable for forming a spring structure (e.g., one or more of molybdenum (Mo), a "moly-chrome" alloy (MoCr), tungsten (W), a titanium-tungsten alloy (Ti:W), chromium (Cr), and nickel (Ni)). In other embodiments, spring material film 520 is formed using Si, nitride, oxide, carbide, or diamond. The thickness of spring material film 520 is determined in part by the selected spring material, desired spring constant and shape of the final spring structure, as discussed in additional detail below.

Figure 5C:
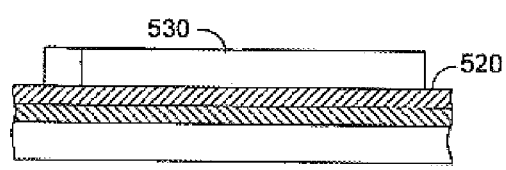
Figure 6:
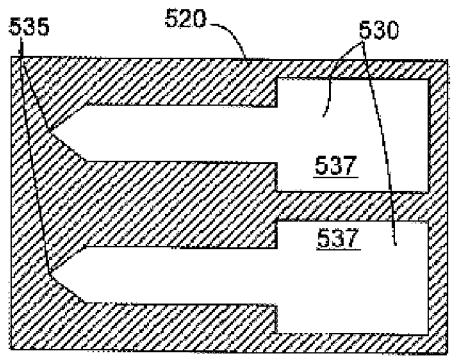
FIG. 6 is a top view showing a spring mask formed over a spring material film during the fabrication process shown in FIG. 5(C)

Referring to FIGS. 5(C) and 6, elongated spring masks 530 (e.g., photoresist) are then patterned over selected portions of spring material film 520. Note that each spring mask 530 is formed in the shape of the desired spring probe, and may include a pointed tip 535 at one end, as shown in FIG. 6 (see discussion below related to in-plane tips). Alternatively, the ends of spring mask 530 may be blunted to provide a suitable platform for forming an out-of-plane tip (also discussed below). Note that a base portion 537 of mask 530 that is used to form the fixed (anchor) portion of the spring probe is depicted as being rectangular, but can have any selected shape (e.g., V-shape, U-shaped, J-shaped, L-shaped, etc.). The fixed end of the subsequently formed spring probe may thus be formed wider than the cantilever section.

Figure 5D:
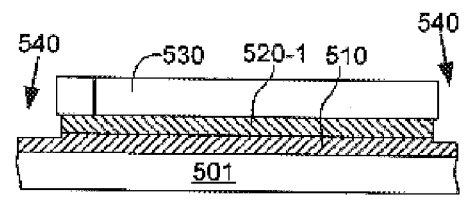

Next, as indicated in FIG. 5(D), exposed portions of spring material film 520 surrounding spring mask 530 are etched using one or more etchants 540 to form a spring island 520-1. Note that this etching process is performed such that limited etching occurs in release layer 510 surrounding spring material island 520-1. In one embodiment, the etching step may be performed using, for example, a wet etching process to remove exposed portions of spring material film 520. This embodiment was successfully performed using cerric ammonium nitrate solution to remove a MoCr spring metal layer. In another embodiment, anisotropic dry etching is used to etch both spring material film 520 and the upper surface of release layer portion 510B. This embodiment may be performed, for example, with Mo spring metal, and Si or Ti release layers. Mo, Si and Ti all etch in reactive fluorine plasmas. An advantage of dry etching the spring material film is that it facilitates finer features and sharper tipped spring probes. Materials that do not etch in reactive plasmas may still be etched anisotropically by physical ion etching methods, such as Argon ion milling. In yet another possible embodiment, the etching step can be performed using the electro-chemical etching process described in IBM J. Res. Dev. Vol. 42, No. 5, page 655 (Sep. 5, 1998), which is incorporated herein by reference. Many additional process variations and material substitutions are therefore possible and the examples given are not intended to be limiting.

Figure 5E:
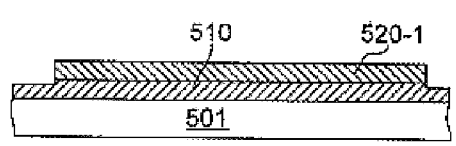
Figure 5F:
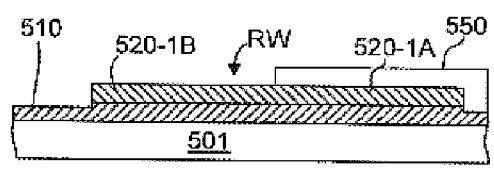

FIG. 5(E) shows spring material island 520-1 and release material 510 after spring mask 530 (FIG. 5(D)) is removed. Next, as shown in FIG. 4(F), a release mask 550 is formed on a first portion 520-1A of spring material island 520-1. Release mask 550 defines a release window RW, which exposes a second portion 520-1B of spring material island 520-1 and surrounding portions release material layer 510. Release mask 550 may also serve as a strapping structure to further secure first portion 520-1A (i.e., fixed end 210; see FIG. 2) to wafer 501. In one embodiment, release mask 550 is formed using photoresist. In other embodiments, a suitable metal or epoxy may be used.

Figure 5G:
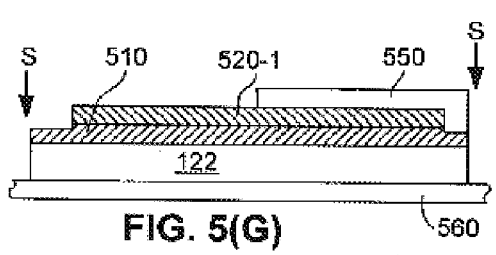

Referring to FIG. 5(G), the wafer is diced (indicated by arrows S) to form substrate 122, which is further processed (if necessary) to modify substrate 122 for attachment to holder plate 130 (see FIG. 1). In the present embodiment, dicing is performed before spring material island 520-1 is released from release layer 510 (described below with reference to FIG. 5(H)) to prevent damage to the lifted structure, for example, by a water jet used to perform the dicing process. Dicing after release would require beam structure passivation, for example, using resist or wax. After dicing, each substrate 122 is held into place by a sticky dicing tape 560 (i.e., the dicing blade only cuts through the wafer but not through the underlying sticky dicing tape 560).

Figure 5H:
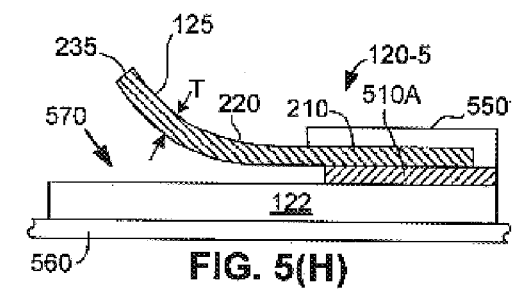

Finally, as indicated in FIG. 5(H), a release etchant 570 (e.g., a buffered oxide etch) is then use to selectively remove a portion of the release material layer from beneath the exposed portion of the spring material island to form spring probe 125. Specifically, removal of the exposed release material causes cantilever section 220 to bend away from wafer 501 due to the internal stress variations established during the formation of the spring material film (discussed above). Note that fixed end (anchor portion 210) remains secured to substrate 122 by release material (support) portion 510A, which is protected by release mask 550. Note also that resist mask 550 may be optionally removed from fixed end 210 of spring probe 125 after release. The release step can be done with all diced chips on dicing tape 560, which is subsequently removed to separate individual probe assemblies 120-5. After being removed from dicing tape 560, probe assembly 120-5 is mounted onto an SPM holder chip using a double-side sticky tape, or by clamping, soldering or gluing. Probe assembly 120-5 is now ready for use in an SPM system, such as that shown in FIG. 1.

Figure 7:
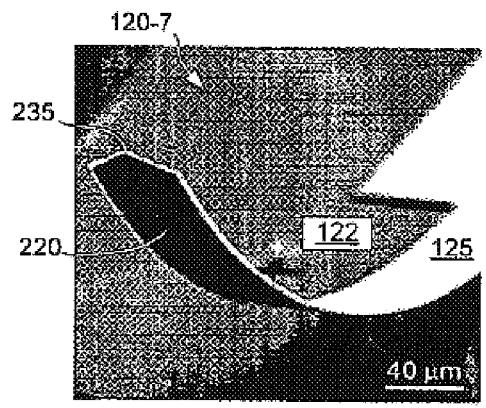
FIG. 7 is an enlarged photograph showing an actual probe assembly produced in accordance with the fabrication process described with reference to FIGS. 5(A) through 5(H)

FIG. 7 is an enlarged photograph showing an actual probe assembly 120-7 that was produced by the present inventors utilizing the fabrication process described above. Note that tip 235 of spring probe 125 is formed "in-plane" (i.e., etched from or aligned with the stress-engineered spring material layer used to form spring probe 125). The width of cantilever portion 220 is approximately 40 µm, and the lift height (i.e., the distance from tip 235 to substrate 122) is approximately 100 µm.

Another advantage of spring probe 125 over conventional probes is that the above-described fabrication process is significantly less expensive than that required to produce conventional probes. Conventional probes are typically bulk micromachined from high-quality, and therefore expensive, monocrystalline Si substrates. Conventional probes require etching away the entire substrate beneath each probe, which is a time-consuming and costly process, and yields a relatively small number of probes per wafer. In comparison, the spring probes of the present invention are formed using a relatively inexpensive lithographic process that yields a significantly larger number of spring probes per wafer. Another advantage is that spring probe fabrication uses a mask aligner with only topside alignment capability, whereas conventional probe fabrication requires special and expensive aligners with backside alignment capability.

As mentioned above, spring probe 125 (see FIG. 5(H)) has a stiffness (spring constant) that is generally determined by its thickness T in the growth direction, its length, and to a lesser extend, its width. For measuring topography in an SPM contact mode, the spring constant should be relatively low (1–3 N/m or smaller). A relatively low spring constant can be produced using a relatively thin stress-engineered spring material film 520 (e.g., $\leq 1.5$ µm) and forming a relatively long spring material island (e.g., greater than 100 microns). Spring probes with higher spring constants (e.g., 5–50 N/m) can be produced using shorter and/or thicker spring material islands. Such high spring constant probes are used, for example, for tapping mode measurements (i.e., where the cantilever section is vibrated at a resonance frequency) and electrical SPM measurements (i.e., to facilitate relatively hard pressing of the probe tip against the sample to make good electrical contact).

Figure 8:
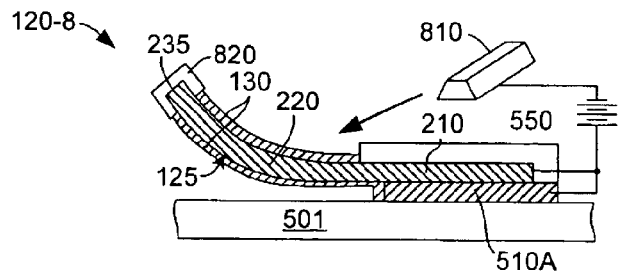
FIG. 8 is a simplified cross-sectional side view showing a probe assembly including metal plating according to another embodiment of the present invention.

FIG. 8 is a simplified cross-sectional side view showing a probe assembly 120-8 according to yet another embodiment of the present invention. As discussed above with reference to FIG. 5(H), the thickness T of spring probe 125 is defined during the deposition (e.g., sputter) process. However, as depicted in FIG. 8, a coating (e.g., metal plating) 130 can also be deposited on spring probe 125 to increase the thickness (and, hence, the spring constant) of spring probe 125. In one embodiment, coating 130 is a metal plated on both sides (i.e., top and bottom surfaces) of cantilever section 220 using, for example, a post-release electroplating process (as indicated in FIG. 8). In another embodiment, coating 130 is deposited (e.g., sputtered or evaporated) on only one side using a pre- or post-release deposition process. Note that the electroplating process shown in FIG. 8 involves applying opposite biases to a target 810 and to spring probe 125, which can be applied via release material portion 510A, if formed from an electrically conductive material. Plating 130 can also be extended over anchor portion 230 by removing release mask 550 prior to the plating process. When tip 235 is in-plane (described further below), a mask 820 or other protection is preferably used during the plating process to maintain tip sharpness. An optional passivation metal layer (not shown) may also be provided as a seed material for the plating process if the spring material film does not serve as a good base metal.

Several additional advantages associated with spring probes of the present invention arise from the ability to form "in-plane" probe tips, as compared with the out-of-plane tips utilized in conventional probes. In-plane tips are formed in (or parallel to) the plane defined by the stress-engineered spring material film, but point away from this plane when the spring probe is released.

In-plane tips can either be formed by shaping the spring material film to form a sharp point (tip), or by forming a tip material layer over the spring material film. When an in-plane tip is formed by shaping the spring material into a sharp point, this shaping is during the spring material film etching process (described above with reference to FIGS. 5(D) and 6). The sharp point is directed along the surface of substrate 122 before release, but points away from substrate 122 after release (see FIG. 8). Such in-plane tips are less expensive to produce than conventional out-of-plane tips because the additional processing needed to produce the out-of-plane tips is eliminated. Further, in-plane tips allow for narrower probe widths at free end 230 than is possible using conventional probes, which require wide cantilever sections to produce and support the out-of-plane tips. These narrower free end widths facilitate visual inspection of the probed region, which is difficult using conventional probes because the wide cantilever obscures the necessary line of sight to the probed region.

Figure 9A:
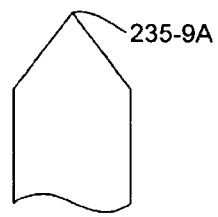
FIGS. 9(A), 9(B), and 9(C) are top views showing several alternative in-plane tips formed by etching a spring material film according to an aspect of the present invention.
Figure 9B:
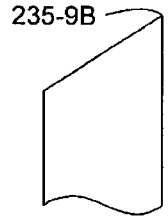
Figure 9C:
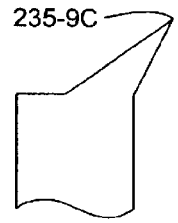

FIGS. 9(A) through 9(C) are top views showing several alternative in-plane tips formed by etching the spring material film. In addition to longitudinally oriented tip 235-A (which is similar to that shown in FIG. 8), the spring material can be etched to form off-center tips that, for example, facilitate electrical measurements (described below). Examples of such off-center tips are shown in FIGS. 9(B) (tip 235-B) and FIG. 9(C) (tip 235-C), which illustrate how the shape of in-plane probe tips may be arbitrarily designed to point away from the longitudinal axis of the respective spring probe. In-plane probe tips formed by etching the spring material film are believed to generate a sharpness in the range of 20–100 nm, which is acceptable for many applications. This sharpness can be improved using additional etching steps (e.g. reactive ion etching (RIE), FIB).

Figure 10A:
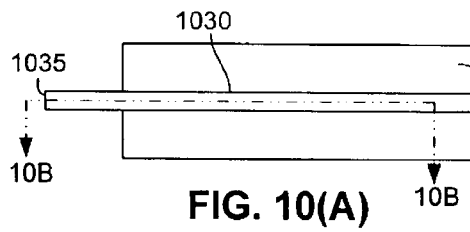
FIGS. 10(A) and 10(B) are top and cross-sectional side views, respectively, showing a partially formed probe assembly including a thin wire tip formed over the spring material according to another embodiment of the present invention.
Figure 10B:
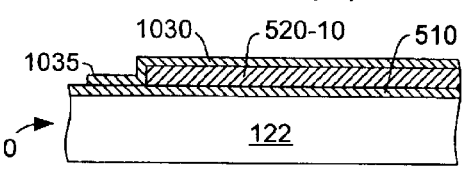

FIGS. 10(A) and 10(B) are top and cross-sectional side views showing a partially formed probe assembly 120-10 according to another embodiment of the present invention. As indicated in FIG. 10(B), probe assembly 120-10 includes a thin metal wire 1030 formed over spring material island 520 (i.e., after the spring material film etching process described above with reference to FIG. 5(D)). Metal wire 1030 is formed from a suitable metal, epoxy or resist, and includes a tip 1035 that extends beyond the end 525 of spring material island 520-10. During a subsequent release process, release material 510 is etched from beneath spring material island 520-10 and metal wire 1030, thereby causing spring material island 520-10 to bend away from substrate 110. Tip 1035 is believed to generate a sharpness in the range of 20 to 100 nm.

Figure 11A:
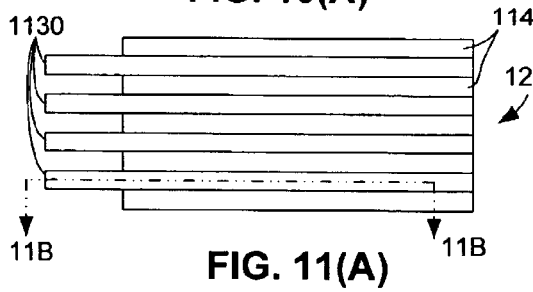
FIGS. 11(A) and 11(B) are top and cross-sectional side views, respectively, showing a partially formed multi-probe assembly including multiple wire tips according to yet another embodiment of the present invention.
Figure 11B:
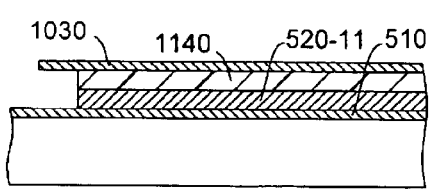

FIGS. 11(A) and 11(B) are top and cross-sectional side views showing a partially formed multi-probe assembly 120-11 according to yet another embodiment of the present invention. Multi-probe assembly 120-11 includes several parallel thin metal wires 1130 formed on an insulating layer 1140, which in turn is formed on spring material island 520. Insulating layer 1140 prevents conduction between wires 1130, thereby facilitating electrical measurements using multi-probe assembly 120-11.

Figure 12A:
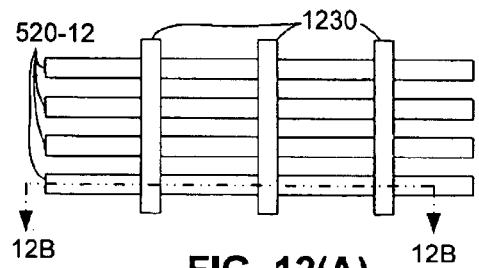
FIGS. 12(A) and 12(B) are top and cross-sectional side views showing another partially formed multi-probe assembly with non-conductive tether bars according to yet another embodiment of the present invention.
Figure 12B:
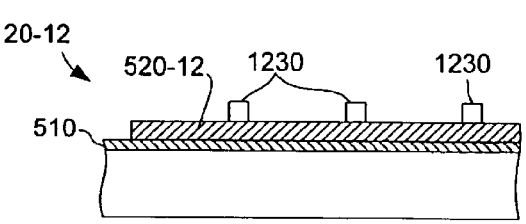

FIGS. 12(A) and 12(B) are top and cross-sectional side views showing another partially formed multi-probe assembly 120-12 according to yet another embodiment of the present invention. Multi-probe assembly 120-12 includes several parallel spring material islands 520-12 formed on a release layer 510, and a series of optional tether bars 1230 linking the parallel spring material islands. Tether bars 1230 are formed from an insulating material (e.g., epoxy or resist), and serve to mechanically connect and maintain a fixed distance between parallel spring material islands 520-12 after release. In this way, spring material islands 520-12 are electrically insulated (i.e., when release layer 510 is also insulating), and therefore can also be used for electrical measurements, as discussed below.

Referring back to FIG. 2, several additional new functionalities are facilitated because fixed end 210 of spring probe 125 is mounted on transparent substrate 122 and maintained parallel to surface 116 of underlying sample 115 (or stage 110). As set forth above, transparent substrate 122 facilitates convenient laser-based measurements, and when combined with narrow in-plane probe tips, also facilitates convenient observation of the probed region of sample 115. Further, as indicated in FIG. 2, fixed end 210 lies in a first plane P1 that is parallel to a plane P2 defined by sample 115 (or stage 110). These features facilitate the formation of low-cost multi-probe assemblies, such as probe assemblies 120-11 and 120-12 (discussed above with reference to FIGS. 11(A) through 12(B)) and the probe arrays described below with reference to FIGS. 13 and 14(A) through 14(E), that include two or more spring probes arranged, for example, to perform electrical measurements.

At the time of the present invention, the microelectronics industry was seeking a method for measuring the resistivity of tiny metal traces on a sample surface. There are commercial SPM modules available for electrical measurements (e.g. scanning capacitance microscopy (SCM), scanning spreading resistance microscopy (SSRM), tunneling AFM, electrical force microscopy (EFM)). Two- and four-tip probe assemblies are highly desired for measuring resistivity directly on semiconductor devices using these systems. However, such probe assemblies formed using conventional single tip probes are difficult to produce, and therefore very expensive. Further, the wide cantilever section needed at the free end to support conventional out-of-plane tips makes it difficult to form conventional probe assemblies with tips arranged in close proximity, and the wide cantilever section located adjacent to the tips obscures the probed area. Therefore, there is a demand for electrically conductive probes that can be used in these electrical measurement systems that overcomes the problems associated with conventional probes. Note that similar multi-probe arrangement can be used to fabricate thermocouple probe assemblies.

Figure 13:
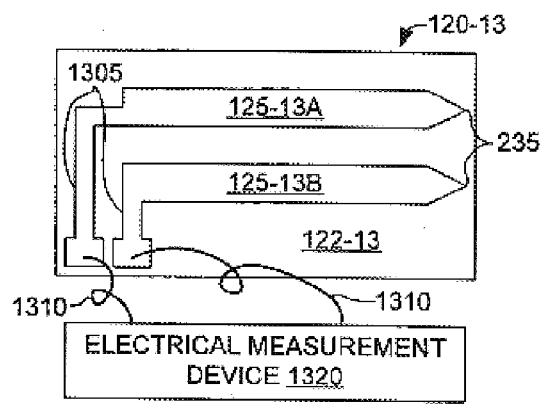
FIG. 13 is a top view showing a simplified two-tip probe assembly arranged for electrical measurements using existing SPM systems according to yet another embodiment of the present invention.

FIG. 13 is a top view showing a simplified two-tip probe assembly 120-13 showing an example of how the multi-probe assemblies of the present invention overcome the problems associated with conventional probe assemblies and facilitates convenient electrical measurements using existing SPM systems. Each spring probe 125-13A and 125-13B is provided with an in-plane tip 235 that facilitates narrow tip width and close tip spacing, as described above. Further, transparent substrate 122 allows observation of the sample region to be probed, thereby facilitating convenient alignment of probe tips 235 with a sample region of interest. Each spring probe 125-13A and 125-13B is also electrically connected by conductive traces 1305, which are formed on substrate 122 using, for example, non-released spring metal, that are connected by wires 1310 to a suitable measurement device 1320 (e.g., a voltmeter).

Figure 14A:
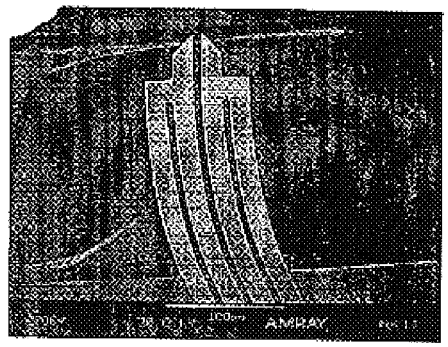
FIGS. 14(A), 14(B), 14(C), 14(D), and 14(E) are photographs showing actual two- and four-tip probe assemblies produced according to five additional embodiments of the present invention.
Figure 14B:
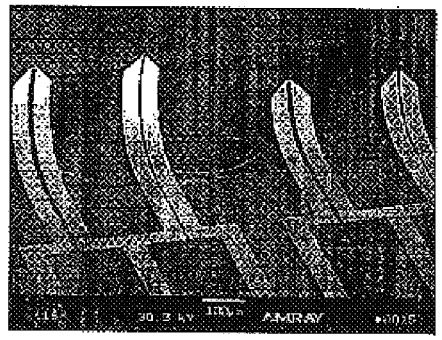
Figure 14C:
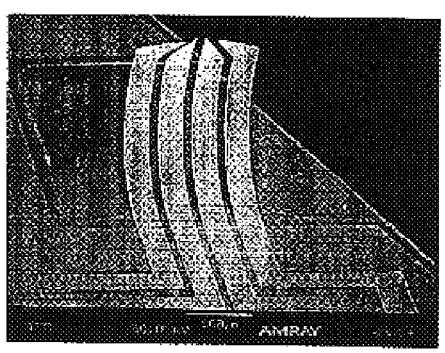
Figure 14D:
Figure 14E:
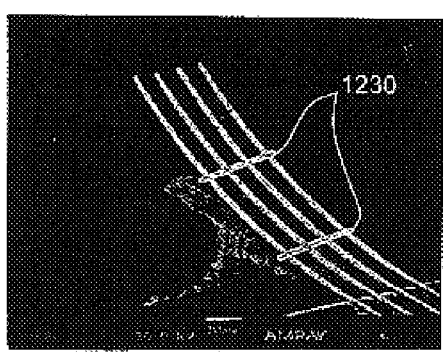

FIGS. 14(A) though 14(E) are photographs showing actual two- and four-tip probe assemblies produced by the present inventors. As indicated in these figures, these probe assemblies are formed with minimal spacing (e.g., 6 $\mu$m or less) between adjacent probe tips. Note that FIG. 14(E) depicts a four-tip probe assembly including tether bars 1230, which are described above with reference to FIGS. 12(A) and 12(B).

Referring again to FIG. 2, another advantage provided by the present invention over conventional probes arises because free end 230 of cantilever section 220 can be formed substantially perpendicular to sample surface 116. For example, the curvature of cantilever section 220 determines the angle at which free end 230 contacts sample 115. Further, as described below, the curvature of the cantilever section can be further modified using load layers (described below) to form a substantially straight free end section that is aligned perpendicular to an underlying sample, thereby facilitates completely new functionalities for SPM systems, such as measuring super-high-topography samples.

Currently, deep reactive ion etching (DRIE) is a rapidly growing technology critical for realizing many MEMS structures. Accurately measuring the depths (10–100 s of microns) and widths (1–50 microns) of vias is required for controlling the etch process and device performance. Further, non-destructive process monitoring is important in a manufacturing environment. Conventional macroscopic profilometry is limited to vias greater than 100 $\mu$m laterally and vertically. Conventional optical detection-based products offer in-situ process monitoring, but are limited to vias with lateral dimensions in the 100 s of microns, depend on optical properties of the sample surface, have limited reference beam position flexibility, and are expensive. To measure etch widths less than 100 $\mu$m, destructive cross sectional SEM is currently the only reliable method. Monitoring large area regions greater than 100 $\mu$m does not provide accurate measurements of narrow regions on the same wafer because DRIE has strong size-dependent etch rates that vary depending on the local loading or particular etch recipe. Non-destructive high-aspect ratio etch-depth monitoring for the dimensions many MEMS projects require currently does not exist.

Figure 15A:
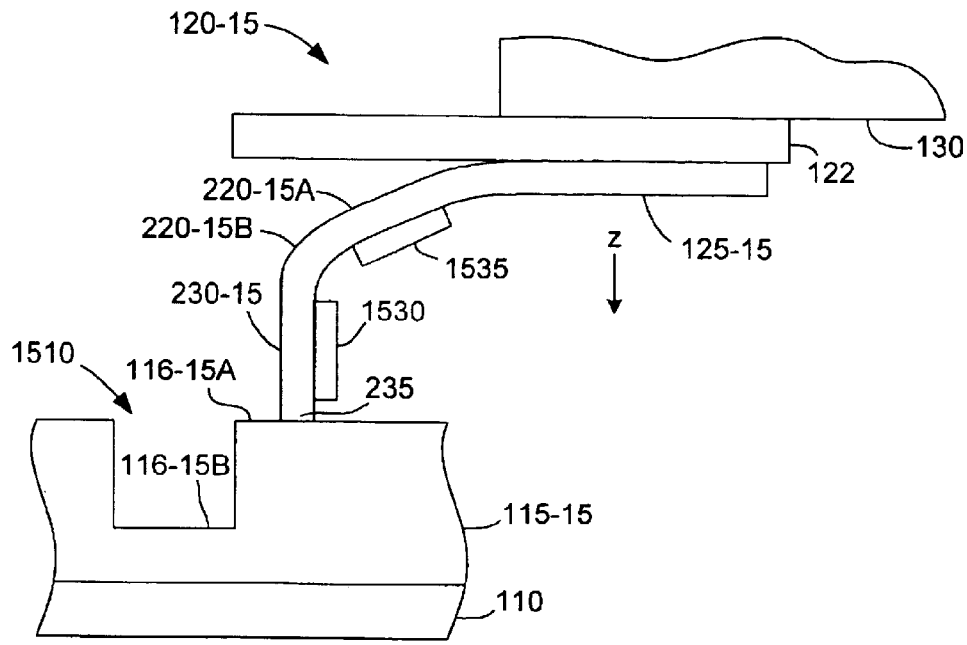
FIGS. 15(A) and 15(B) are side views showing a right-angle probe assembly and illustrating a method for non-destructive, high-aspect ratio via measurement using SPM systems according to yet another embodiment of the present invention.
Figure 15B:
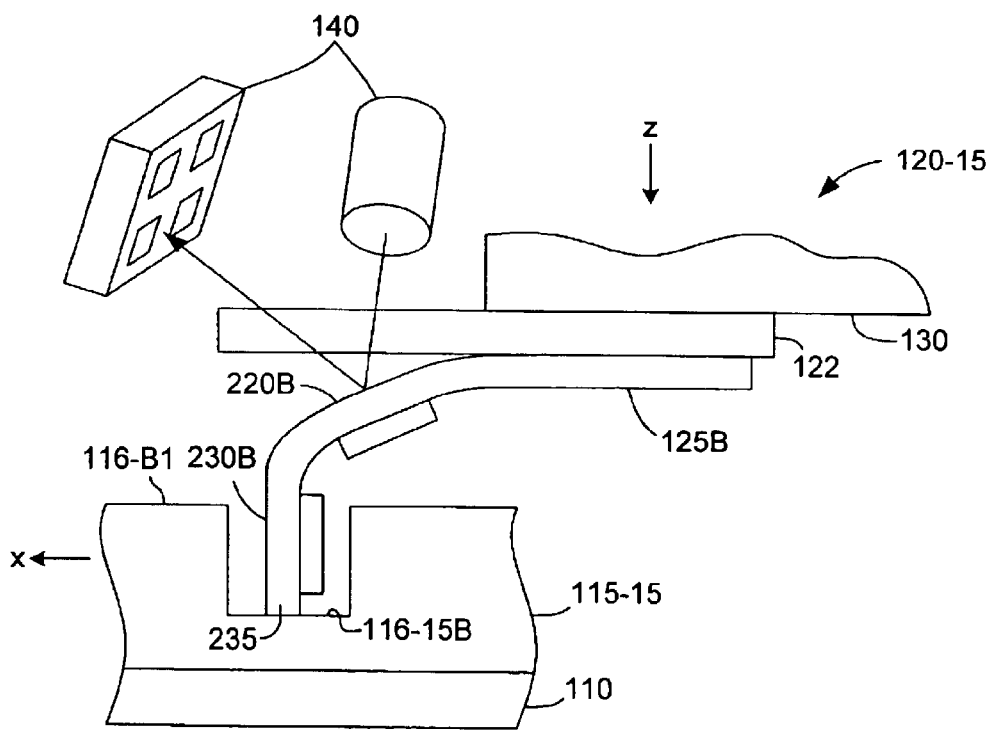

FIGS. 15(A) and 15(B) illustrate a right-angle probe assembly 120-15 that forms a non-destructive depth gauge suitable for measuring a high-aspect ratio vias using SPM systems existing at the time of the present invention. Probe assembly 120-15 includes a spring probe 125-15 having one or more substantially straight sections including a free end 220-15 that is aligned perpendicular to sample 115-15. The straight sections are formed, for example, by selectively depositing load layers 1530 and 1535 onto spring probe 125-15 prior to release. Load layers 1530 and 1535 are formed, for example, by plating or sputtering "zero-stress-stacks" (i.e., stacks of metal or other material having a stress gradient that is opposite to the spring probe) on selected sections of spring probe 125-15. Load layer 1530 is formed over free end 230-15 (but not over tip 235), thereby causing free end 230-15 to remain substantially straight upon release. Furthermore, additional load layers might be deposited onto the cantilever section in order to adjust the cantilever lift height after release. In the example shown in FIG. 15(A), a second load layer 1535 is formed over cantilever section 220-15A to produce a straight section that is also used, for example, for reflecting laser light. Released sections of spring probe 125-15 that are not covered by a load layer bend as described above. For example, cantilever section 220-15B curves according to the internal stress gradient generated during the formation of the spring material film. By combining selected load layers, internal stress gradient, and length of spring probe 125-15, straight free end 230-15 can be aligned perpendicular to an underlying sample 115-15, thereby providing "right-angle" probe assembly 120-15.

According to another aspect of the present invention, right-angle probe assembly 120-15 is utilized in conventional SPM systems to perform low-cost non-destructive depth gauge measurements. For example, a deep etch (via) 116-15 can be measured by providing straight free end 230-15 of right-angle probe assembly 120-15 with a length of 100 $\mu$m or longer. Deep etch 116-15 is measured by positioning right-angle probe assembly 120-15 over a selected reference point (e.g., point 116-15A) on the surface of target 115-15, and then lowering probe assembly 120-15 in the z-axis direction until contact is detected. Conventional SPM systems are provided with hardware and software that facilitates this z-axis displacement of probe assembly 120-15 using a combination of stepper/piezotube movement, and is capable of stopping when laser detection system 140 detects a set point deflection. Further, conventional SPM systems are very sensitive, so that a surface contact force of only one nN of force on sample 115-15 is needed to produce such a set point detection. Next, as shown in FIG. 15(B), after determining the z-axis position at surface point 116-15A, probe assembly 120-15 is moved in the x-axis direction over deep etch 116-15A, and the probe lowering process is repeated until tip 235 strikes bottom surface 116-15B. The depth of deep etch 116-15 is then determined by calculating the difference between the z-axis position of reference point 116-15A and bottom surface 116-15B. The order of these measurements may be reversed.

In addition to the spring probes utilizing in-plane tips described above, nearly every existing out-of-plane tip (e.g., Si, SiOx, SiNx, diamond, or metal) can be integrated on the tip of spring probes 125. That is, although in-plane tips provide several advantages over out-of-plane tips, in some instances the characteristics of an out-of-plane tip may be beneficial. Several examples of spring probes incorporating conventional tip materials are described in the following paragraphs.

Figure 16A:
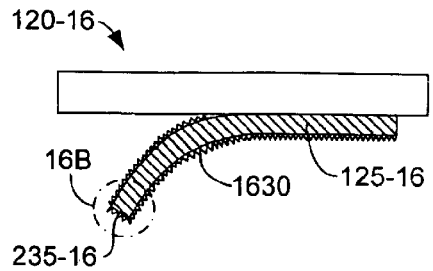
FIG. 16(A) is a cross-sectional side view showing a probe assembly including a diamond film formed thereon according to yet another embodiment of the present invention.
Figure 16B:
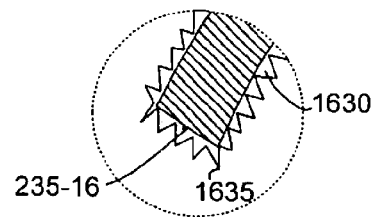
FIG. 16(B) is an enlarged view of region 16B of FIG. 16(A)

FIG. 16(A) is a cross-sectional side view showing a probe assembly 120-16 including a diamond film 1630 formed on tip 235-16 of a spring probe 125-16, and FIG. 16(B) is an enlarged view of region 16B of FIG. 16(A). When the sharpness of in-plane probe tips (described above) is inadequate for a particular purpose, diamond film 1630 may be deposited onto spring probe 125-16 before or after release. Diamond film 1630 does not only give superior hardness to tip 235-16 but also high sharpness as the diamond can be deposited in such a way that ultra-sharp crystals 1635 are formed on tip 235-16. The formation of such diamond films is taught, for example, in "CVD Diamond for Tips in Nanoprobe Experiments", Niedermann et al., J. Vac. Sci. Technol., A14, p. 1233 (1996). Diamond film 1630 can also be made electrically conductive by doping using known techniques.

Figure 17:
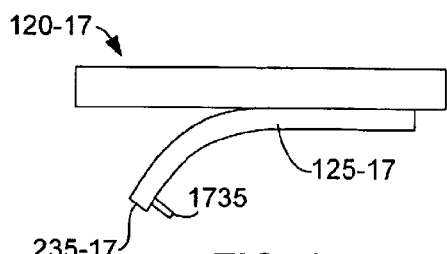
FIG. 17 is a simplified cross-sectional side view showing a probe assembly including an out-of-plane tip according to yet another embodiment of the present invention.
Figure 18:
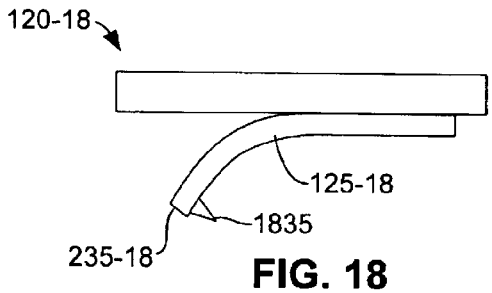
FIG. 18 is a simplified cross-sectional side view showing a probe assembly including an out-of-plane tip according to yet another embodiment of the present invention.

FIGS. 17 and 18 are simplified cross-sectional side views showing probe assemblies 120-17 and 120-18 that respectively include out-of-plane tips 1735 and 1835, which are formed using two out-of-plane tip forming methods. As shown in FIG. 17, tip 1735 is deposited directly onto spring probe 125-17 adjacent to tip 235-17 using methods like FIB, EBD or carbon-nanotube growth. Alternatively, as shown in FIG. 18, tip 1835 is formed by etching a material deposited on the surface of spring probe 125-18 prior to release. In each embodiment, tips 1735 and 1835 are formed prior to the release process, but may also be attached after release by manual tip transfer.

Figure 19A:
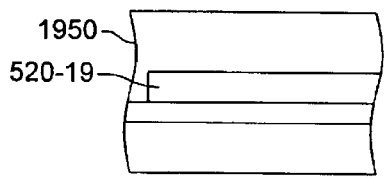
FIGS. 19(A), 19(B), 19(C), 19(D), and 19(E) are simplified cross-sectional side views showing a process utilized to form the out-of-plane tip shown in FIG. 18.
Figure 19B:
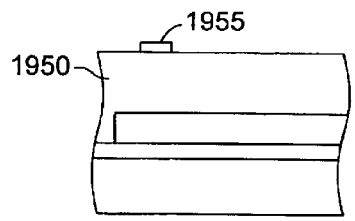
Figure 19C:
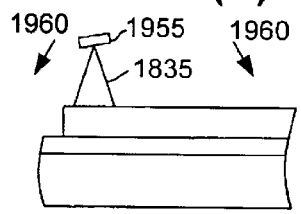
Figure 19D:
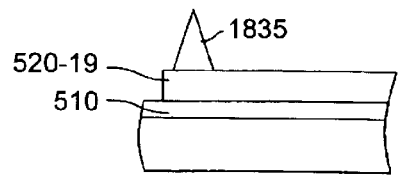
Figure 19E:
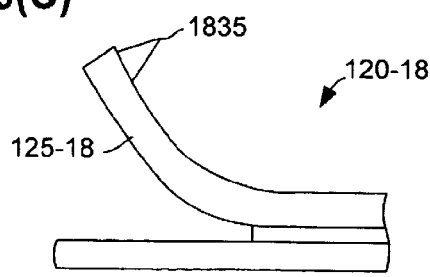

FIGS. 19(A) through 19(D) are simplified cross-sectional side views showing a partial process utilized to form out-of-plane tip 1835 (see FIG. 18). In FIG. 19(A), a tip material layer 1950 is formed over spring material island 520-19 (in an alternative embodiment, the tip material can be formed over the stress-engineered layer before the spring material film etching step). A tip mask 1955 is then formed on tip material layer 1950 (FIG. 19(B)), and then isotropic or anisotropic etching is performed (FIG. 19(C)) using a suitable etchant 1960 according to known techniques to form out-of-plane tip 1835. As shown in FIG. 19(D), tip mask 1955 is then removed, and release layer 110 is etched to release spring probe 125-18, which bends upward to position out-of-plane tip 1835 (FIG. 19(E)). Other fabrication procedures described above are utilized to complete the fabrication process.

The main advantage of out-of-plane tips, such as those shown in FIGS. 16(A), 17 and 18, is that they facilitate tip sharpness of 20 nm or smaller. Of the possible tip materials (e.g., Si, SiOx, SiNx, metal, diamond and polymers), Si and SiNx are currently the mostly used tip material for high resolution in conventional probes, whereas metal and diamond are used for electrical methods.

In addition to forming conventional out-of-plane probe tips onto the spring probes of the present invention, other conventional probe features and aspects of the present invention can be combined to form novel and beneficial probe assemblies. That is, whereas the probe assemblies described above utilize the most cost-effective manufacturing methods, and provide probe chip (substrate) transparency and minimal probe dimensions, probe assemblies can also be produced utilizing novel aspects of the present invention that may use less cost-effect manufacturing methods and/or provide different advantages for special purpose applications. Examples of such probe structures are discussed in the following paragraphs.

Figure 20:
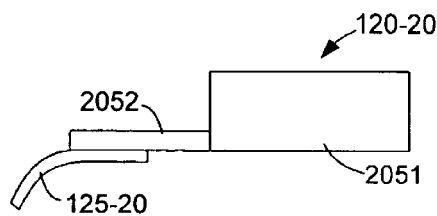
FIG. 20 is a side view showing a simplified probe assembly including a spring probe mounted onto a conventional probe cantilever according to yet another embodiment of the present invention.

FIG. 20 is a side view showing a simplified probe assembly 120-20 including a spring probe 125-20 mounted onto a conventional probe cantilever 2051, which in turn is mounted onto a conventional probe chip 2052. Probe chip 2052 and cantilever 2051 are manufactured using conventional techniques (e.g., bulk micromachining). In one embodiment, cantilever 2051 is formed from a material selected from the group including Si, SiNx, metal, and diamond. In contrast, spring probe 125-20 is formed in accordance with the methods described above, and is either formed directly onto cantilever 2051, or formed separately and mounted onto cantilever 2051 using the peel-off method described below.

Figure 21:
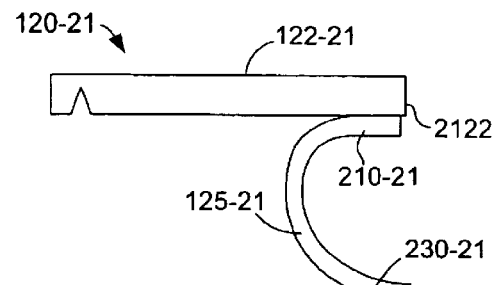
FIG. 21 is a side view showing a probe assembly including an integrated pyramidal out-of-plane tip formed on a spring probe according to yet another embodiment of the present invention.

FIG. 21 is a side view showing a probe assembly 120-21 including an integrated pyramidal out-of-plane tip 2135 formed at free end 230-21 of a spring probe 125-21. Integrated pyramidal out-of-plane tip 2135 is formed using a so-called "moulding" technique, in which a pyramidal mould is etched into Si substrate 122-21 using anisotropic etching. Next, the mould is filled with a material such as metal, diamond or SiNx, or during formation of the spring material film. When formed using the spring material film, no additional lithography steps are required, otherwise an extra lithography step is needed to pattern the metal/diamond/SiNx around the mould region. Next, the Si is etched away and the spring probe 125-21, which is provided with sufficient internal stress to bend more than 180 degrees, lifts from probe substrate 122-21 such that tip 2135 points away from substrate 122-21. Probe substrate 122-21 is in this case made out of monocrystalline Si, and hence it is not transparent. To utilize a laser-based measurement system in this case, the anchor portion 210-21 is positioned adjacent to an edge 2122 of probe substrate 122-21. When spring probe 125-21 is formed with a high-enough stress gradient and a long-enough length, spring probe 125-21 bends out over edge 2122 as shown, and the laser is able to shine onto the back side of free end 230-21.

Figure 22A:
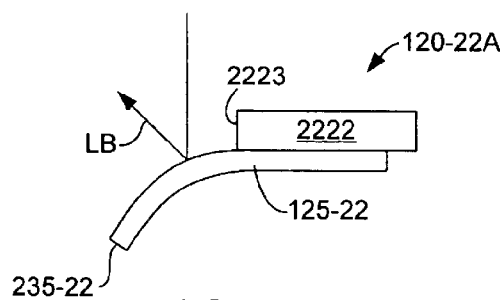
FIGS. 22(A) and 22(B) are side views showing probe assemblies including spring probes extending from front edges of substrates according to further embodiments of the present invention.
Figure 22B:
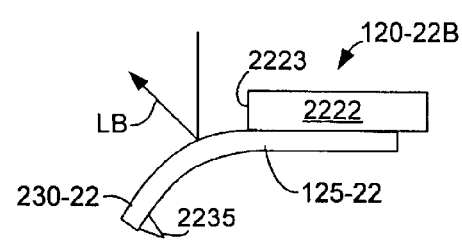

FIGS. 22(A) and 22(B) are side views showing probe assemblies 120-22A and 120-22B, each including a spring probes 125-22 that extends from a front edge 2223 of a substrate 2222. Unlike the probe assemblies described above (e.g., see FIG. 2), spring probe 125-22 is not positioned under a portion of substrate 2222, so substrate 2222 need not be formed from a transparent material. That is, placing a spring probe under a transparent substrate requires viewing and laser-based measurement of the spring probe through the transparent substrate. In some instances where the laser beam angle is too shallow, the transparent substrate may produce total internal reflection of the laser beam. The protruding arrangement shown in FIG. 22(A) is similar to that used in conventional probes, and facilitates direct viewing and/or measurement of in-plane tip 235-22 (as indicated by laser beam LB striking 125-22 without passing through substrate 2222). As indicated in FIG. 22(B), a similar structure includes an out-of-plane tip 2235 formed in the manner described above at free end 230-22 of spring probe 125-22.

Figure 23A:
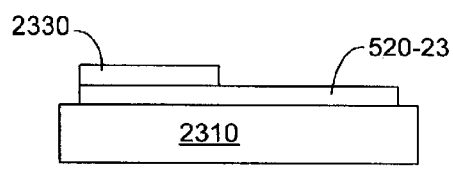
FIGS. 23(A), 23(B), 23(C), and 23(D) are simplified side views showing a peeling-off method utilized to produce probe assemblies according to yet another embodiment of the present invention.
Figure 23B:
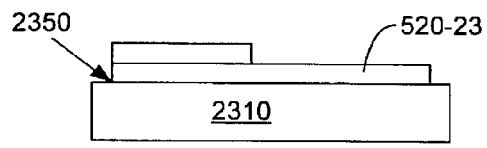
Figure 23C:
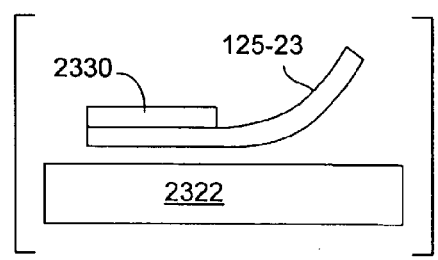
Figure 23D:
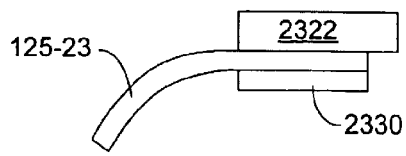
Figure 24:
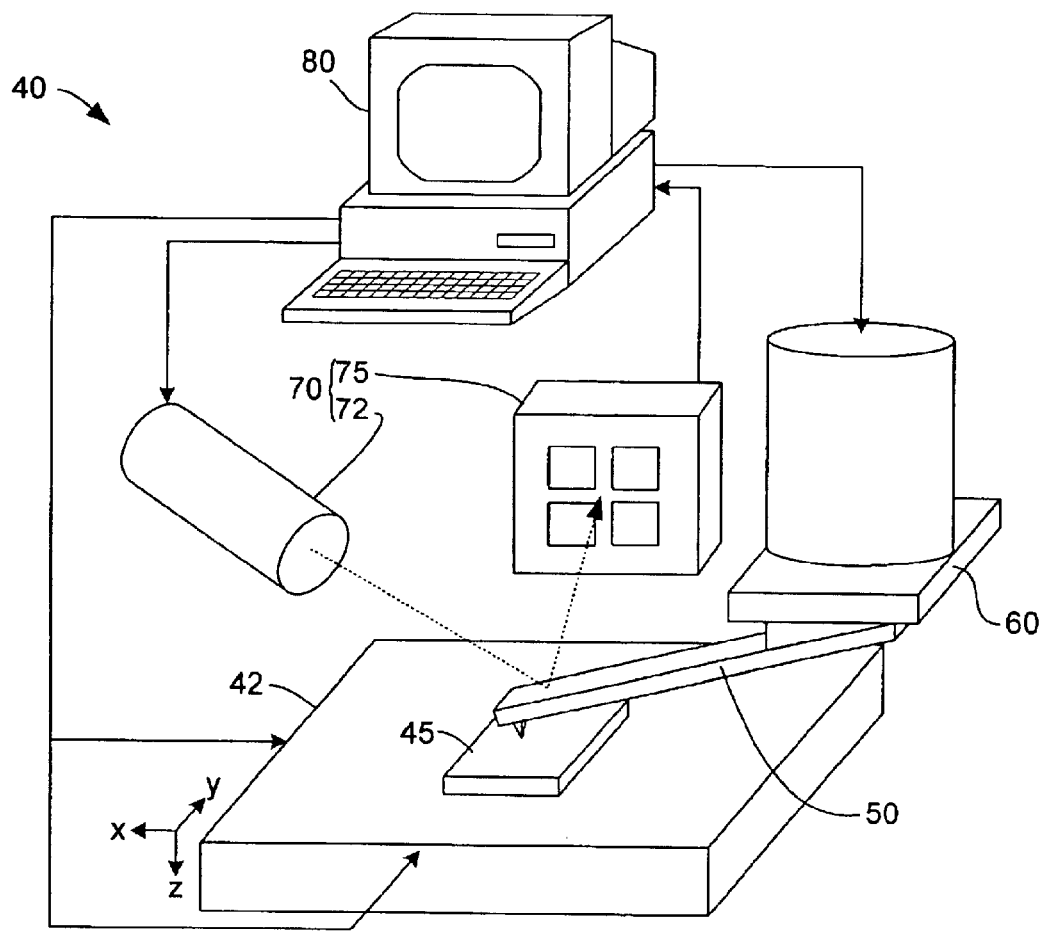
FIG. 24 is a perspective view showing a conventional scanning probe microscope system.
Figure 25:
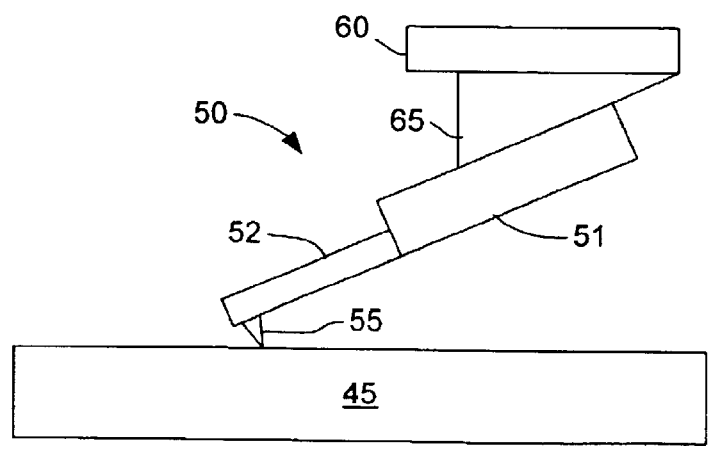
FIG. 25 is a simplified side view showing a conventional probe using in the scanning probe microscope system of FIG. 24.

As noted above, out-of-plane tips, such as probe tip 1835 (see discussion directed to FIG. 18), may be fabricated on a first substrate, removed from the first substrate, and then attached to a spring probe formed in accordance with the present invention using a suitable adhesive. This "peel-off" method is illustrated in FIGS. 23(A) through 23(D), and described in U.S. Pat. No. 6,023,3276, which is incorporated herein in its entirety. As shown in FIG. 23(A), a spring material island 520-23 is formed on a substrate 2310 with zero-stress holder membranes or metal plating sections 2330 formed over a portion thereof. As shown in FIG. 23(B), a peeling force is applied to separate spring probe 125-23 from substrate 2310. Upon separation, spring probe 125-23 releases, as shown in FIG. 23(C). Finally, the separated spring probe 125-23 is attached using a suitable adhesive (not shown) to a probe chip 2322.

Although the present invention has been described with respect to certain specific embodiments, it will be clear to those skilled in the art that the inventive features of the present invention are applicable to other embodiments as well, all of which are intended to fall within the scope of the present invention. For example, although the present invention is disclosed with reference to SPM systems utilizing "optical lever" laser-based measurement methods, other measurement (detection) schemes (e.g., capacitive, resistive, piezoresistive, magnetic, optical, and thermal detection) can be used as well. To support these measurement schemes, a conductive/semi-conductive/magnetic film (e.g., metal or indium-tin-oxide (ITO)) is structured under, onto, or next to the lifted spring probe in such a way that the up-and-down movement of the cantilever section leads to changes in resistance, capacitance or temperature in this cantilever-sensor configuration. In this way, the sample topography can be detected. Lateral forces of the cantilever might also be detected by such an arrangement, or by placing extra sensing electrodes close to the side of the probe. Further, in addition to the topographical and electrical measurements described herein, the probe assemblies of the present invention can be utilized for magnetic, optical, and thermal measurements.

We claim:

1. A scanning probe system for determining electrical characteristics between two locations on a sample, the scanning probe system comprising:

a stage having a surface for mounting the sample;

a probe assembly including:

a substrate, a first spring probe having a fixed end attached to the substrate, a curved central section bending away from the substrate, and a free end including a probe tip for contacting a first location of the sample, and a second spring probe having a fixed end attached to the substrate, a curved central section bending away from the substrate, and a free end including a probe tip for contacting a second location of the sample; and an electrical measurement device having a first terminal connected to the first spring probe, and a second terminal connected to the second spring probe, wherein the first and second spring probes comprise stress-engineered spring material films having an internal stress gradient.

2. The scanning probe system according to claim 1, wherein the substrate is formed from an electrically insulating material, and wherein each of the first and second spring probes is connected by a respective conductor to the electrical measurement device.

3. The scanning probe system according to claim 1, wherein the free ends of the first and second spring probes are shaped to form sharp points, and wherein the respective probe tips of the first and second spring probes are formed by the sharp points.

4. The scanning probe system according to claim 1, further comprising:

a third spring probe having a fixed end attached to the substrate, a curved central section bending away from the substrate, and a free end including a probe tip for contacting a third location of the sample, and a fourth spring probe having a fixed end attached to the substrate, a curved central section bending away from the substrate, and a free end including a probe tip for contacting a fourth location of the sample, wherein the curved central sections of first, second, third and fourth spring probes are parallel.

5. The scanning probe system according to claim 1, further comprising a non-conductive tether bar connected between the curved central sections of the first and second spring probes.

6. The scanning probe system according to claim 1, wherein the non-conductive tether bar comprises at least one of an epoxy and resist.

7. The scanning probe system according to claim 1, wherein the stage supports the sample in a plane, and wherein the scanning probe system further comprises:

a holder plate for supporting the probe assembly over the stage;

a motor connected to the holder plate for selectively moving the probe assembly relative to the sample in a direction perpendicular to the plane; and a computer/workstation for controlling the motor to cause contact between the tip of the spring probe and the sample, and for controlling one of the stage and the holder plate to cause relative movement between the stage and the probe assembly in the plane such that the tip scans along the surface of the sample.

8. The scanning probe system according to claim 1, wherein each of the first and second spring probes further comprise a support portion located between the fixed end and the substrate.

9. The scanning probe system according to claim 8, wherein the support portion comprises one or more of silicon (Si), silicon-nitride (SiNx), silicon-oxide (SiOx), and titanium (Ti).

10. The scanning probe system according to claim 1, wherein each of the first and second springs probe comprises one or more selected from molybdenum (Mo), tungsten (W), titanium (Ti), chromium (Cr), nickel (Ni), silicon (Si), silicon oxide (SiOx), silicon nitride (SiNx), carbide, and diamond.

11. The scanning probe system according to claim 1, wherein each of the first and second springs probes comprises a molybdenum-chromium alloy (MoCr).

12. The scanning probe system according to claim 1, wherein the substrate of the probe assembly is transparent.

13. The scanning probe system according to claim 12, wherein the transparent substrate is selected from the group including glass, quartz, and plastic.

14. The scanning probe system according to claim 12, further comprising:

means for observing a surface of the sample through the transparent substrate; and means for aligning the spring probe based on information generated by said observing means.

15. The scanning probe system according to claim 1, wherein the electrical measurement device comprises a voltmeter.

16. A scanning probe system for probing a sample, the scanning probe system comprising:

a stage having a surface for mounting the sample;

a probe assembly including a substrate and a spring probe having a fixed end attached to the substrate, a central section separated from the substrate, and a free end including a probe tip positioned adjacent to the stage surface; and an electrical measurement device coupled to the spring probe, wherein the spring probe comprises a stress-engineered spring material film having an internal stress gradient.

17. The scanning probe system according to claim 16, wherein the stage supports the sample in a plane, and wherein the scanning probe system further comprises:

a holder plate for supporting the probe assembly over the stage;

a motor connected to the holder plate for selectively moving the probe assembly relative to the sample in a direction perpendicular to the plane; and a computer/workstation for controlling the motor to cause contact between the tip of the spring probe and the sample, and for controlling one of the stage and the holder plate to cause relative movement between the stage and the probe assembly in the plane such that the tip scans along the surface of the sample.

18. The scanning probe system according to claim 16, further comprising a measurement device for measuring deformation of the spring probe caused by interaction between the probe tip and the sample.

19. The scanning probe system according to claim 18, wherein the measurement device comprises:

a laser for generating a laser beam that is directed to strike a selected section of the spring probe; and a photosensor array positioned to receive portions of the laser beam reflected from the selected section of the spring probe.

20. The scanning probe system according to claim 16, wherein the substrate of the probe assembly is transparent.

21. The scanning probe system according to claim 20, wherein the transparent substrate is selected from the group including glass, quartz, and plastic.

22. The scanning probe system according to claim 20, further comprising:

means for observing a surface of the sample through the transparent substrate; and means for aligning the spring probe based on information generated by said observing means.

23. A scanning probe system for determining electrical characteristics of a sample, the scanning probe system comprising:

a stage having a surface for mounting the sample;

a probe assembly including:

a transparent substrate, and a spring probe having a fixed end attached to the transparent substrate, a curved central section bending away from the substrate, and a free end including a probe tip for contacting a corresponding location of the sample;

means for observing a surface of the sample through the transparent substrate;

means for aligning the spring probe based on information generated by said observing means such that the tip of the spring probe contacts a first location on the sample; and means coupled to the spring probe for measuring electrical characteristics of the first location by measuring electrical signals generated on the spring probe, wherein the spring probe comprises a stress-engineered spring material film having an internal stress gradient.

24. A scanning probe system for determining electrical characteristics of a sample, the scanning probe system comprising:

a stage having a surface for mounting the sample;

a probe assembly including:

a substrate, and a spring probe having a fixed end attached to the substrate, a curved central section bending away from the substrate, and a free end including a probe tip for contacting a corresponding location of the sample;

means for moving the tip of the spring probe relative to the sample such that the tip of the spring probe scans along a surface of the sample; and means coupled to the spring probe for measuring electrical characteristics of sample by measuring electrical signals generated on the spring probe, wherein the spring probe comprises a stress-engineered spring material film having an internal stress gradient.

* * * * *